US012276850B2

United States Patent
Wilkerson et al.

(10) Patent No.: US 12,276,850 B2
(45) Date of Patent: Apr. 15, 2025

(54) FANOUT MODULE INTEGRATING A PHOTONIC INTEGRATED CIRCUIT

(71) Applicant: ADVANCED MICRO DEVICES, INC., Santa Clara, CA (US)

(72) Inventors: Brett P. Wilkerson, Austin, TX (US); Raja Swaminathan, Austin, TX (US); Kong Toon Ng, Hsinchu (TW); Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 18/357,376

(22) Filed: Jul. 24, 2023

(65) Prior Publication Data

US 2024/0019649 A1 Jan. 18, 2024

Related U.S. Application Data

(63) Continuation of application No. 17/361,033, filed on Jun. 28, 2021, now Pat. No. 11,709,327.

(60) Provisional application No. 63/179,776, filed on Apr. 26, 2021.

(51) Int. Cl.
*G02B 6/42* (2006.01)
*G02B 6/43* (2006.01)

(52) U.S. Cl.
CPC ........... *G02B 6/4274* (2013.01); *G02B 6/425* (2013.01); *G02B 6/4255* (2013.01); *G02B 6/43* (2013.01)

(58) Field of Classification Search
CPC .... G02B 6/4274; G02B 6/425; G02B 6/4255; G02B 6/43; G02B 6/4269
See application file for complete search history.

(56) References Cited

U.S. PATENT DOCUMENTS

| 11,054,597 | B2 | 7/2021 | Raghunathan et al. |
| 11,493,689 | B2 | 11/2022 | Yu et al. |
| 2019/0285804 | A1 | 9/2019 | Ramachandran et al. |
| 2019/0317287 | A1 | 10/2019 | Raghunathan et al. |
| 2020/0132949 | A1 | 4/2020 | Huang et al. |
| 2020/0271860 | A1 | 8/2020 | Chen et al. |
| 2022/0342165 | A1 | 10/2022 | Wilkerson et al. |

(Continued)

FOREIGN PATENT DOCUMENTS

| WO | 2021048349 A1 | 3/2021 |
| WO | 2022232048 A1 | 11/2022 |

OTHER PUBLICATIONS

International Search Report and Written Opinion, PCT/US2022/026181, Aug. 8, 2022, 13 pages.

*Primary Examiner* — John Bedtelyon

(57) ABSTRACT

A semiconductor package includes a first mold layer at least partially encasing at least one photonic integrated circuit. A redistribution layer structure is fabricated on the first mold layer, the redistribution layer structure including dielectric material and conductive structures. A second mold layer at least partially encasing at least one semiconductor chip is fabricated on the redistribution layer structure. The redistribution layer structure provides electrical pathways between the at least one semiconductor chip and the at least one photonic integrated circuit. One or more voids are defined in the second mold layer in an area above an optical interface of the at least one photonic integrated circuit such that light is transmittable through dielectric material above the optical interface.

16 Claims, 13 Drawing Sheets

(56) References Cited

U.S. PATENT DOCUMENTS

2022/0365294 A1   11/2022  Chen et al.
2022/0392881 A1*  12/2022  Yu .......................... G02B 6/122

* cited by examiner

```
Fabricate A First Mold Layer At Least Partially Encasing At Least One Photonic
Integrated Circuit 1502
            │
            ▼
Fabricate, On The First Mold Layer, A Redistribution Layer Structure Including
Dielectric Material And Conductive Structures 1504
            │
            ▼
Fabricate, On The Redistribution Layer, A Second Mold Layer At Least Partially
Encasing At Least One Semiconductor Chip, Wherein The Redistribution Layer
Structure Provides Electrical Pathways Between The At Least One
Semiconductor Chip And The At Least One Photonic Integrated Circuit 1506

Attach At Least One Spacer To An Area Of The Dielectric Material That
    Is Above The Optical Interface Of The At Least One Photonic Circuit
    1702
                    │
                    ▼
    Deposit Encapsulant Material Around The At Least One Semiconductor
    Chip And The At Least One Spacer 1704
            │
            ▼
Remove One Or More Portions Of The Second Mold Layer In An Area Above An
Optical Interface Of The At Least One Photonic Integrated Circuit Such That Light
Is Transmittable Through Dielectric Material Above The Optical Interface 1508

Cut Around The At Least One Spacer 1802
                    │
                    ▼
    Remove The At Least One Spacer, Wherein The At Least One Spacer Is
    Attached To The Dielectric Material Using Release Film 1804
```

FIG. 18

FANOUT MODULE INTEGRATING A PHOTONIC INTEGRATED CIRCUIT

CROSS-REFERENCE TO RELATED APPLICATION

This application is a Continuation application for patent entitled to a filing date and claiming benefit of earlier-filed U.S. Non-Provisional application Ser. No. 17/361,033, filed Jun. 28, 2021, which claims priority to U.S. Provisional Patent Application Ser. No. 63/179,776, filed Apr. 26, 2021. Each patent application cited herewith is hereby incorporated by reference in its entirety.

BACKGROUND

Photonic integrated circuits are more prevalent today than ever. A photonic integrated circuit is a device that integrates multiple photonic functions and as such is similar to an electronic integrated circuit. The major difference between the two is that a photonic integrated circuit provides functions for information signals imposed on optical wavelengths typically in the visible spectrum or near infrared. The most commercially utilized material platform for photonic integrated circuits is indium phosphide (InP), which allows for the integration of various optically active and passive functions on the same chip. Initial examples of photonic integrated circuits were simple 2-section distributed Bragg reflector (DBR) lasers, consisting of two independently controlled device sections—a gain section and a DBR mirror section. Consequently, all modern monolithic tunable lasers, widely tunable lasers, externally modulated lasers and transmitters, integrated receivers, and the like are examples of photonic integrated circuits.

When a photonic integrated circuit is integrated with a semiconductor chip (e.g., a logic die), the photonic integrated circuit provides an interface that allows data to be conveyed through light signals to and from the semiconductor device over optical fiber. A 2.5D architecture for such integration includes a photonic integrated circuit mounted on a substrate with a semiconductor chip. The photonic integrated circuit is coupled to the optical fiber and to conductor traces on the substrate providing electrical pathways to the semiconductor chip. However, such an architecture is unable to provide high density, short distance interconnection to achieve desired performance and efficiency. Tighter integration of the photonic integrated circuit and the semiconductor chip is hindered by the requirement that the photonic integrated circuit must remain accessible for interfacing with the optical fiber.

BRIEF DESCRIPTION OF THE DRAWINGS

FIG. 18 is a flowchart of another example method of fabricating a fanout module integrating a photonic integrated circuit according to some implementations.

DETAILED DESCRIPTION

Figure 1:
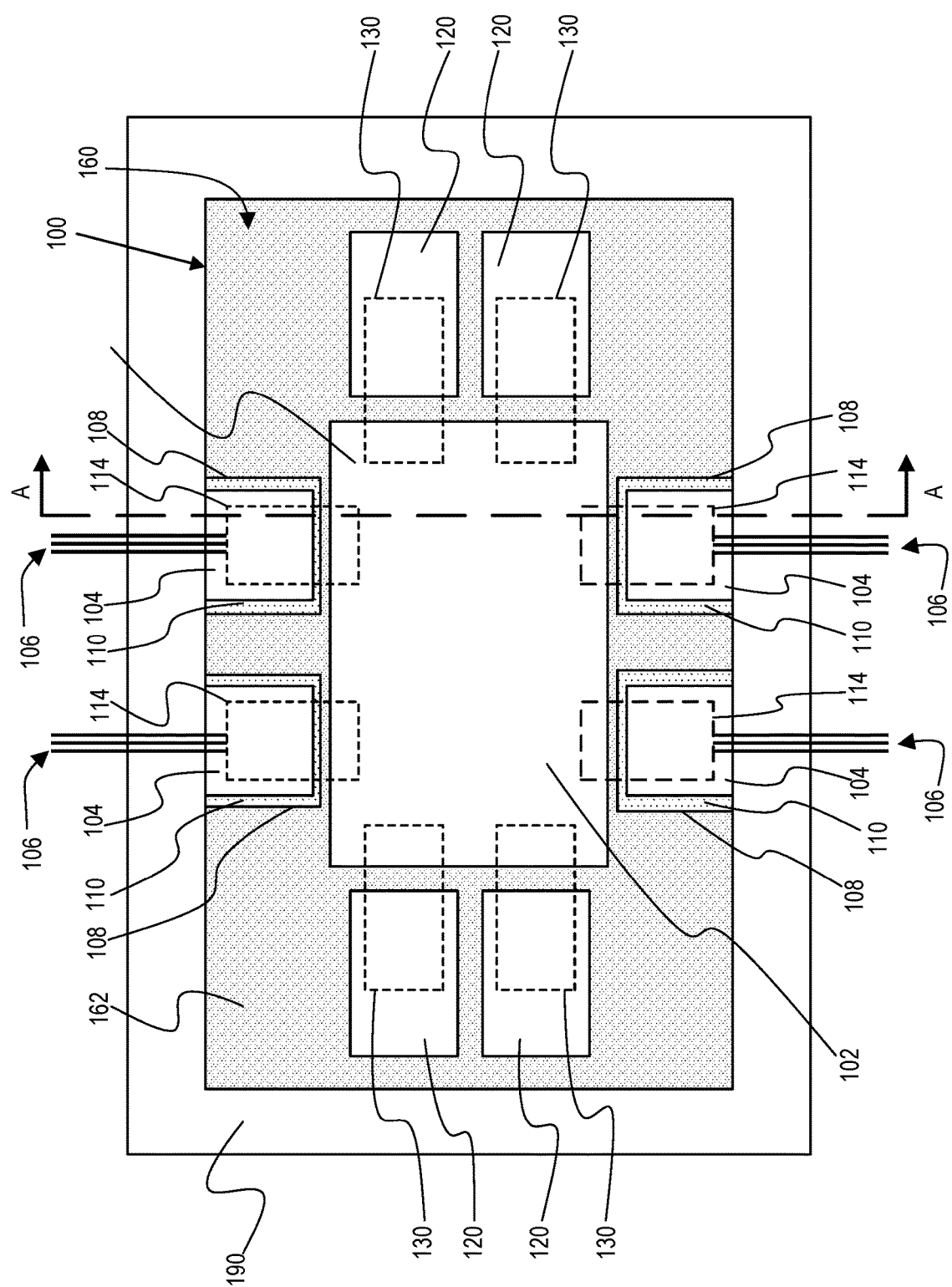
FIG. 1 sets forth a block diagram of an example semiconductor module implementing a fanout module integrating a photonic integrated circuit according to some implementations of the present disclosure.

Implementations in accordance with the present disclosure provide an architecture and fabrication process for a semiconductor package that allows a semiconductor chip to be co-packaged with one or more photonic integrated circuits while enabling high-density interconnection between the semiconductor chip and the photonic integrated circuit. The architecture allows access to the photonic integrated circuit from outside of the package structure through voids in an upper mold layer encasing the semiconductor chip. Optical couplings are disposed in these voids for conveying light signal to and/or from the photonic integrated circuit. The photonic integrated circuit is embedded in a lower mold layer below the first mold layer to allow a short distance, high density interconnect between the photonic integrated circuit and the semiconductor chip. In this way, optical fiber is coupled to the package structure to convey light to and from the photonic integrated circuit while maintaining short electrical pathways between the photonic integrated circuit and the semiconductor chips.

An implementation is directed to a method of fabricating a fanout module integrating a photonic integrated circuit in accordance with the present disclosure. The method includes fabricating a first mold layer at least partially encasing at least one photonic integrated circuit. The method also includes fabricating, on the first mold layer, a redistribution layer structure including dielectric material and conductive structures. The method also includes fabricating, on the redistribution layer, a second mold layer at least partially encasing at least one semiconductor chip, wherein the redistribution layer structure provides electrical pathways between the at least one semiconductor chip and the at least one photonic integrated circuit. The method further includes removing one or more portions of the second mold layer in an area above an optical interface of the at least one photonic integrated circuit such that light is transmittable through dielectric material above the optical interface.

In some examples, the method also includes mounting one or more optical fiber couplings on a surface of the dielectric material exposed by the removal of the one or more portions of the second mold layer.

In some examples of the method, fabricating, on the redistribution layer, a second mold layer at least partially encasing at least one semiconductor chip, wherein the redistribution layer structure provides electrical pathways between the at least one semiconductor chip and the at least one photonic integrated circuit, further includes attaching at least one spacer to an area of the dielectric material that is above the optical interface of the at least one photonic circuit. In these examples, the method fabricating the second mold layer further includes depositing encapsulant material around the at least one semiconductor chip and the at least one spacer.

In some examples of the method, removing one or more portions of the second mold layer in an area above an optical interface of the at least one photonic integrated circuit such that light is transmittable through dielectric material above the optical interface further includes cutting around the at least one spacer and removing the at least one spacer, wherein the at least one spacer is attached to the dielectric material using release film.

In some examples, the method also includes attaching a plurality of solder structures to a plurality of conductive pillars embedded within the first mold layer.

In some examples, the first mold layer includes at least one bridge structure, the second mold layer includes at least one peripheral device, and the redistribution layer structure provides communication pathways between the at least one semiconductor chip and at least one peripheral device via the bridge structure.

Another implementation is directed to a semiconductor package implementing a fanout module integrating a photonic integrated circuit in accordance with the present invention. The semiconductor package includes a first mold layer at least partially encasing at least one photonic integrated circuit. The package also includes a redistribution layer structure on the first mold layer, the redistribution layer structure including dielectric material and conductive structures. The package further includes a second mold layer at least partially encasing at least one semiconductor chip on the redistribution layer structure. The redistribution layer structure provides electrical pathways between the at least one semiconductor chip and the at least one photonic integrated circuit. One or more voids are defined in the second mold layer in an area above an optical interface of the at least one photonic integrated circuit such that light is transmittable through dielectric material above the optical interface.

In some examples of the semiconductor package, the photonic integrated circuit includes an interface surface on which are disposed the optical interface and a plurality of metal interconnects. In these examples, the metal interconnects are disposed in an area of the first mold layer beneath the semiconductor chip and at least some of the metal interconnects are electrically connected to the semiconductor chip through the redistribution layer structure. In some examples, the photonic integrated circuit includes through-silicon vias electrically connecting at least some of the metal interconnects to solder structures on a bottom surface of the semiconductor package. In some examples, a section of the redistribution layer above the optical interface is composed of only dielectric material.

In some examples, the semiconductor package includes one or more optical fiber couplings mounted on a surface of the dielectric material of the redistribution layer structure that is exposed within the one or more voids defined in the second mold layer.

In some examples of the semiconductor package, the first mold layer encases a plurality of conductive pillars electrically connecting solder structures on a bottom surface of the semiconductor package device to the redistribution layer structure.

In some examples of the semiconductor package, the photonic integrated circuit receives power and ground from the conductive pillars through the redistribution layer structure.

Yet another implementation is directed to an apparatus for a fanout module integrating a photonic integrated circuit in accordance with the present disclosure. The apparatus includes a substrate and a semiconductor package mounted on the substrate. The semiconductor package includes a first mold layer at least partially encasing at least one photonic integrated circuit. The package also includes a redistribution layer structure on the first mold layer, the redistribution layer structure including dielectric material and conductive structures. The package further includes a second mold layer at least partially encasing at least one semiconductor chip on the redistribution layer structure. The redistribution layer structure provides electrical pathways between the at least one semiconductor chip and the at least one photonic integrated circuit. One or more voids are defined in the second mold layer in an area above an optical interface of the at least one photonic integrated circuit such that light is transmittable through dielectric material above the optical interface.

In some examples of the semiconductor package, the photonic integrated circuit includes an interface surface on which are disposed the optical interface and a plurality of metal interconnects. In these examples, the metal interconnects are disposed in an area of the first mold layer beneath the semiconductor chip and at least some of the metal interconnects are electrically connected to the semiconductor chip through the redistribution layer structure. In some examples, the photonic integrated circuit includes through-silicon vias electrically connecting at least some of the metal interconnects to solder structures on a bottom surface of the semiconductor package. In some examples, a section of the redistribution layer above the optical interface is composed of only dielectric material. The apparatus further includes one or more optical fibers coupled to the optical couplings.

In some examples of the apparatus, the photonic integrated circuit includes an interface surface on which are disposed the optical interface and a plurality of metal interconnects. In these examples, the metal interconnects are disposed in an area of the first mold layer beneath the semiconductor chip and at least some of the metal interconnects are electrically connected to the semiconductor chip through the redistribution layer structure. In some examples, the photonic integrated circuit includes through-silicon vias electrically connecting at least some of the metal interconnects to solder structures on a bottom surface of the semiconductor package. In some examples, a section of the redistribution layer above the optical interface is composed of only dielectric material.

In some examples, the apparatus includes one or more optical fiber couplings mounted on a surface of the dielectric material of the redistribution layer structure that is exposed within the one or more voids defined in the second mold layer.

Implementations in accordance with the present disclosure will be described in further detail beginning with FIG. 1. Like reference numerals refer to like elements throughout the specification and drawings. FIG. 1 sets forth a block diagram of an example architecture of a fan-out package structure 100 in accordance with some implementations of the present disclosure. Implementations of the package structure 100 architecture can be useful in high performance applications, such as, for example, a personal computer, a notebook, a tablet, a smart phone, a storage data center, or applications involving large scale databases and/or analytics, such as finance, life sciences, and/or artificial intelligence. Many other applications are possible. Additionally, the example package structure 100 can be assembled as described herein in a manner that includes a photonic integrated circuit (PIC) that is co-packaged with a semiconductor chip such a processing unit. Moreover, the example package structure (100) also provides short distance electrical connection to the semiconductor chip while still offering access for optical fiber coupling to the PIC.

The example package structure depicted in FIG. 1 includes a semiconductor chip 102 at least partially encapsulated in an encapsulant material 162 in a mold layer 160. The semiconductor chip 102 can be any of a variety of integrated circuits. A non-exhaustive list of examples includes a microprocessor, a central processing unit (CPU), a graphics processing unit (GPU), an accelerated processing unit (APU) that combines aspects of both, an application specific integrated circuit, and the like. The mold layer 160 includes multiple voids 108 exposing a dielectric material 110 beneath the mold layer 160. The dielectric material 110 can be dielectric material of a redistribution layer (RDL) structure below the mold layer 160. Optical couplings 104 are disposed in the voids 108 on the dielectric material 110. The optical couplings 104 are suited to couple optical fiber 106 to the package structure 100.

Although not visible in the view of FIG. 1, the example package structure 100 includes another mold layer embedding PIC modules 114, shown in dashed lines as they are obscured from the view of FIG. 1. The PIC modules 114 convert electrical signals into light signals or convert light signals into electrical signals, or both. The semiconductor chip 102 overhangs a portion of the PIC modules 114, such that input/output (I/O) interconnects at the periphery of the active face of the semiconductor chip 102 are in proximity to interconnects of the PIC modules 114. The optical couplings 104 are disposed above a different portion of the PIC modules 114 that includes an optical interface. The optical interface includes components for sending or receiving light signals, or for sending and receiving light signals, such as photodetectors, optical modulators, lasers, digital-to-analog converters, analog-to-digital converters, amplifiers, and so on. Implementations disclosed herein are not reliant on particular implementations of the PIC modules 114, and it will suffice that access to the optical interface of the PIC modules 114 is required to convey light signals that are converted to/from electrical signals by the PIC modules 114. Data is transmitted via light signals to and/or from the PIC modules over the optical fiber 106. Electrical signals convey data between the PIC modules 114 and the semiconductor chip 102 though electrical pathways.

In some implementations, peripheral devices (e.g., high bandwidth memory (HBM) devices or other stacked memory devices) can be co-packaged with the semiconductor chip 102. FIG. 1 illustrates that the example package structure 100 includes co-package peripheral devices such as memory devices 120. The memory devices 120 are also encapsulated in the mold layer 160. Electrical pathways between the memory devices 120 and the semiconductor chip 102 include bridge structures 130 embedded in the same mold layer (not visible in FIG. 1) as the PIC modules 114. The bridge structures 130 are shown in dashed lines as they are obscured from view in FIG. 1. The bridge structures 130 can be an interconnect chip that includes first conductive structures on the surface of the interconnect chip proximate to the semiconductor chip 102 and second conductive structures on the surface of the interconnect chip proximate to a memory device 120, and a substrate portion that includes conductive traces connecting the first and second conductive structures on the surface of the interconnect chip.

In some implementations, the example package structure 100 is mounted on a substrate 190 for supplying power and ground to the components of the package structure 100 and for providing I/O pathways to external components.

Figure 2:
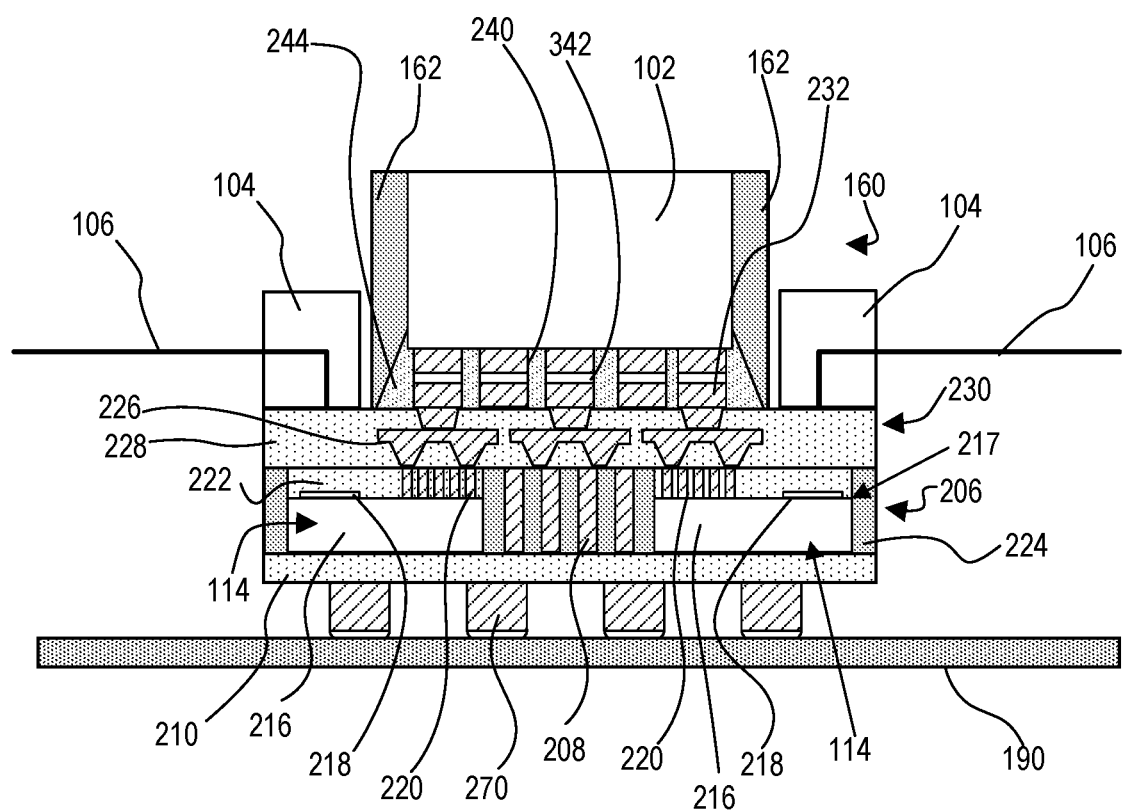
FIG. 2 sets forth a block diagram that is a cross section view of the example semiconductor module implementing a fanout module integrating a photonic integrated circuit according to some implementations of the present disclosure.
Figure 3:
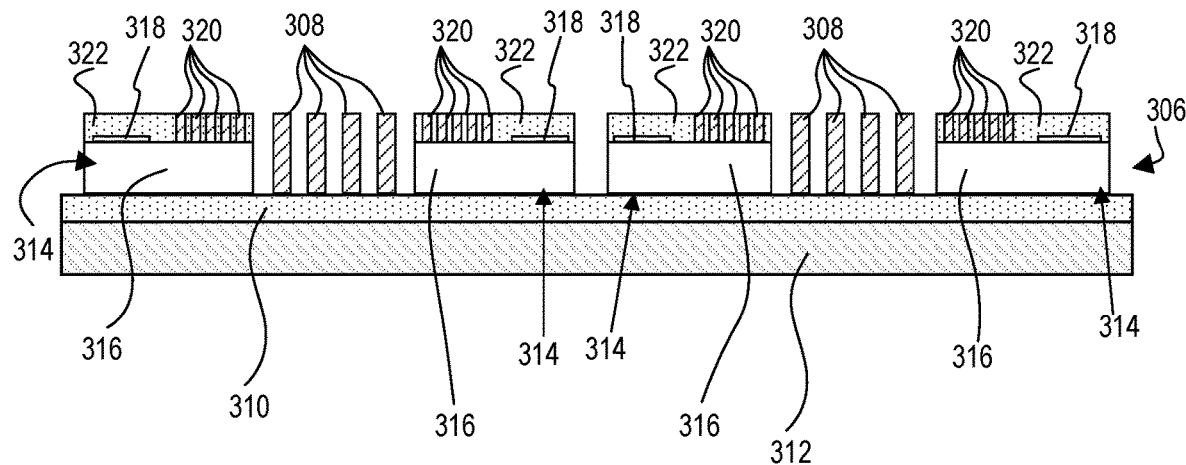
FIG. 3 is a portion of an example process flow for fabricating a fanout module integrating a photonic integrated circuit according to some implementations.

For further explanation, FIG. 2 depicts a cross section view of the example package structure 100 of FIG. 1 in accordance with some implementations. The cross section is taken along line A in FIG. 1. The example package structure 100 of FIG. 2 includes a mold layer 206 having embedded therein a PIC module 114 and multiple conductive pillars 208 at least partially encased in encapsulant material 224. The mold layer 206 is fabricated on a dielectric layer 210. The PIC module 114 includes a PIC die 216 having a connectivity region 217 on one side of the PIC die 216 upon which is disposed an optical interface 218 and PIC interconnects 220. In various examples, the optical interface 218 includes a photodetector that receives light signals that are converted by circuitry into electrical signals. In various examples, the optical interface 218 includes a laser or other light source that transmits light signals that have been converted by circuitry in the PIC die 216 from electrical signals received through the PIC interconnects 220. The optical interface 218 is suitable for interfacing with a light conveyance such as optical fiber. The conductive structures are suitable for interfacing with conductive traces and vias of a redistribution layer (RDL) structure 230. A dielectric material 222 is deposited on the connectivity region 217 to encase the optical interface and partially encase the PIC interconnects 220. In some examples, the dielectric material 222 is a polymer such as a polyimide. The dielectric layer 210 can also be composed of a polymer material such as a polyimide.

The conductive pillars 208 can be composed of a conductive metal such as copper, or another conductive metal.

In some implementations, copper is used. Conductive bumps 270 are applied to the conductive pillars 208 through apertures formed in the dielectric layer 210. The conductive bumps 270 provide solderable connection points for bonding to a substrate 190. For example, the conductive bumps 270 include copper, a tin-silver alloy, or another conductive material suitable for solderable connections. Thus, the conductive bumps 270 and conductive pillars 208 provide a conductive pathway from the surface of the substrate 190 to the RDL structure 230 for providing the conveyance of input/output signals, power, and ground to components within the package structure 100.

The RDL structure 230 is fabricated on the mold layer 306. The RDL structure 230 includes multiple layers that include conductive structures 226 (e.g., traces, pads, vias) and an inter-level dielectric material 228. Traces provide lateral routing of electrical signals while conductive vias dispersed in the dielectric material 328 provide vertical routing of electrical signals from underlying connectors (e.g., PIC interconnects 220) and overlying connectors (e.g., bond pads 232) as well as between layers of traces/pads. The conductive structures 226 can be composed of various conductor materials, such as copper, aluminum, silver, gold, platinum, palladium, laminates of these or others. The dielectric material 228 is a polyimide or other suitable polymer. Vias in a layer of dielectric material 228 overlaying the PIC module 114 connect PIC interconnects 220 of the PIC module 314 to traces/pads in the RDL structure 230. The conductive structures 226 provide an electrical pathway between the PIC interconnects 220 and bond pads 232 on a top surface of the RDL structure 230 that receives the semiconductor chip 102. In some examples, the conductive structures 226 provide an electrical pathway between the PIC interconnects 220 of the PIC module 114 and the conductive pillars 208 for receiving power and ground from the substrate. In other examples, the PIC modules 314 include through-silicon vias (TSVs) (not depicted) that allow the PIC module 114 to receive power and ground from the substrate through solder structures attached at openings in the dielectric layer 210 to the TSVs of the PIC module 114. An area of the RDL structure 230 directly above the optical interface 218 of the PIC module 114 is left void of conductive structures 226 to allow the passage of light through this area of the RDL structure without interference. In some examples, the dielectric material 228 and the dielectric material 222 are the same material.

The semiconductor chip 102 is mounted on the RDL structure 230 and embedded in the mold layer 160. The RDL structure fans out interconnect pathways from the semiconductor chip to the conductive pillars 208, which can in turn connect to fanout structure on the substrate 190. The semiconductor chip 102 is oriented on the RDL structure 230 such that a portion of the semiconductor chip 102 is disposed above the PIC interconnects 220, to minimize the distance traveled by electrical signals between the PIC module 114 and the semiconductor chip 102, without substantially overhanging the optical interface 218 of the PIC module, to allow the passage of light through the RDL structure 230 to and from the optical interface 218. The semiconductor chip 102 includes a substrate constructed of silicon, germanium, or other types of semiconductor materials, and which include various functional logic blocks, logic gates, clocks, buses, and other elements formed in the substrate as will be appreciated by those of skill in the art. Implementations disclosed herein are not reliant on particular functionalities of the semiconductor chip 102. The semiconductor chip 102 also includes a die interface (e.g., a die-level build-up structure such as a back end of line (BEOL) layer created during die fabrication) that includes layers of metallization and inter-level dielectric layers, as well as conductor structures such as vias, traces, and pads. The die interface includes a number of metal interconnects 240 (e.g., microbumps) that are bonded to counterpart bond pads 232 disposed on the surface of the RDL structure 230 for conveying power, ground, input signals, and output signals. In some examples, the semiconductor chip 102 is constructed with a physical layer or "PHY" region, which has various internal and external conductor structures dedicated to the transmission of chip-to-chip signals, and a non-PHY region, which has conductor structures that are tailored more to the conveyance of power and ground and/or chip-to-substrate signals.

Underfill material 244 is deposited between the semiconductor chip 102 and the RDL structure 230 and around the bonded bond pads 232 and interconnects 240. The underfill material 244 is composed of well-known polymeric underfill material such as epoxies. The semiconductor chip 102, underfill material 244, interconnects 240, and bond pads 232 are all at least partially encased in encapsulant material 162 to form the mold layer 160.

Optical couplings 104 are affixed to an area of the RDL structure 230 above the optical interface 218 of the PIC module 114. As previously mentioned, this area of the RDL structure is void of conductor structures 226 and will allow the passage of light to and from the optical interface 218. The optical couplings 104 couple the optical fiber 106 to the package structure 100. In some examples, the optical couplings 104 convey light vertically to and from the optical interface from optical fiber laterally coupled to the package structure 100.

For further explanation, FIGS. 3-14 set forth an example process flow for constructing a semiconductor device, such as the example implementation of a semiconductor device 100 depicted in FIGS. 1 and 2, according to various implementations. Beginning with FIG. 3, a dielectric layer 310 is deposited on a carrier 312 that will support the placement of PIC modules 314 and formation of conductive pillars 308. In some examples, the dielectric layer 310 is a layer of polyimide or other polymer material. The dielectric layer 310 can be applied using spin coating or the like. In some examples, prior to depositing the dielectric layer 310, a release film (not depicted) is applied to the carrier 312. The release film can be a light activated, thermally activated, or other type of adhesive or even some form of tape that can enable the carrier 312 to be removed without destructively damaging the structures mounted thereon at the time of separation. The carrier 312 can be composed of various types of glasses or even semiconductors, such as silicon.

Conductive pillars 308 are then created on the dielectric layer 310 that has been deposited on the carrier 312. Creating conductive pillars 308 on the dielectric layer 310 is carried out by various well-known techniques. In one example, a plating seed layer (not shown) is applied to the dielectric layer 310. The plating seed layer can be composed of a variety of materials that are suitable for plating seed layers, such as copper or the like, and applied by well-known sputtering, chemical vapor deposition, electroless plating or the like. In these examples, a photolithography mask is applied to the plating seed layer and patterned photolithographically to produce plural openings that will be used to plate the conductive pillars 308. With the photolithography mask in place and patterned, a plating process is performed to fabricate the conductive pillars 308. The photolithography mask is stripped using ashing, solvent stripping or the like to yield the conductive pillars 308 positioned on the dielectric layer 310. Portions of the plating seed layer (not shown) on the dielectric layer 310 lateral to the pillars 308 are etched using well-known etch techniques.

PIC modules 314 are then placed on the dielectric layer 310 using a pick and place process and, for example, a die attach film. The PIC modules 314 are created prior to the process flow depicted in FIGS. 3-14. In some examples, the PIC modules 314 include a photonic die 316 having an optical interface 318 and PIC interconnects 320 encapsulated in dielectric material 322. The dielectric material 322 is a polyimide or other suitable polymer. Although not shown, in some examples bridge structures (e.g., an interconnect chip) can also be placed on the dielectric layer 310.

Figure 4:
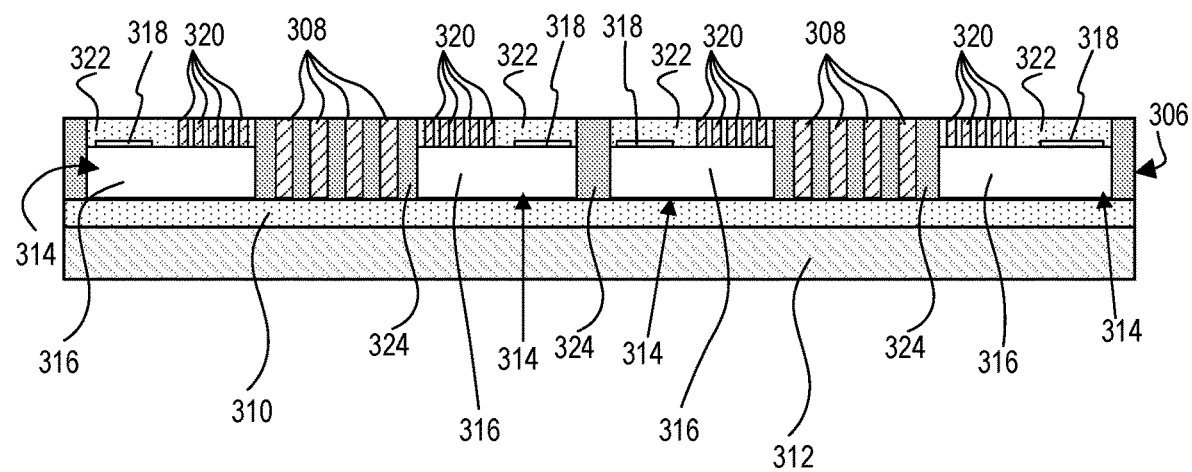
FIG. 4 is another portion of the example process flow for fabricating a fanout module integrating a photonic integrated circuit according to some implementations.

Moving to FIG. 4, a mold layer 306 is fabricated by encasing the PIC module 314 and conductive pillars in encapsulant material 324. In some implementations, encasing the PIC module 314 and conductive pillars 308 is carried out by depositing the encapsulant material 324 on and around the PIC module 314, conductive pillars 308, and exposed portions of the dielectric layer 310. Excess encapsulant material 324 is removed by grinding or etching to expose surfaces of the conductive pillars 308 and surfaces the PIC interconnects 320 of the PIC modules 314. Although not shown, in some examples the encapsulant material 324 is also deposited over bridge structures such that the PIC modules 314 and the bridge structures are included in the mold layer 306.

Figure 5:
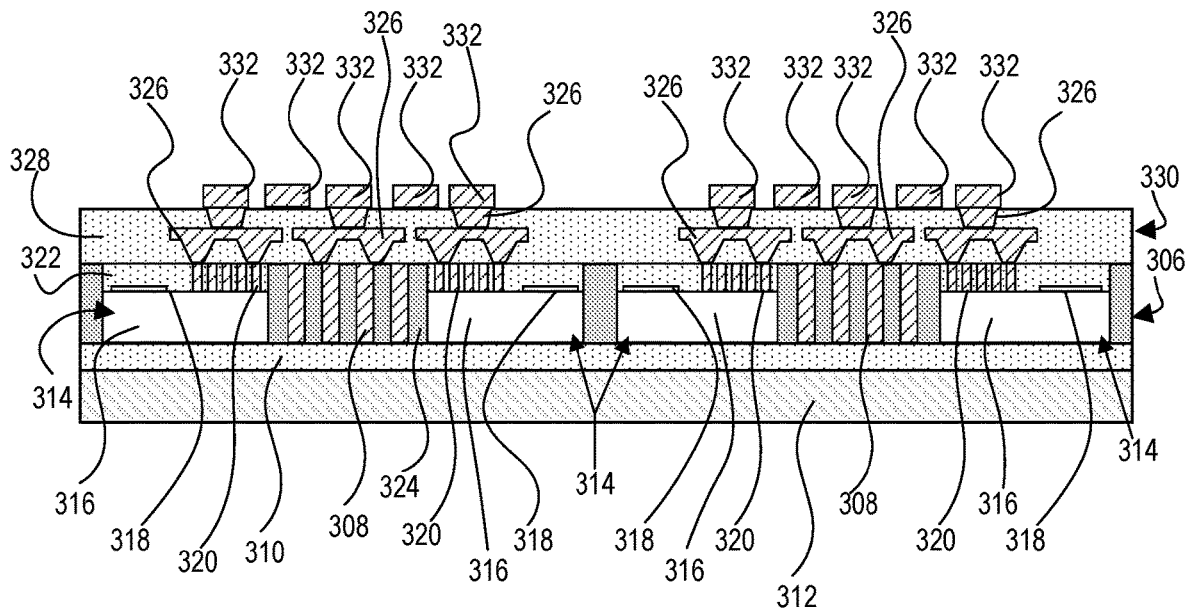
FIG. 5 is another portion of the example process flow for fabricating a fanout module integrating a photonic integrated circuit according to some implementations.

Moving to FIG. 5, an RDL structure 330 is fabricated on the mold layer 306, exposed surfaces of the conductive pillars 308, and the exposed surfaces of the PIC interconnects 320 of the PIC modules 314. The RDL structure 330 includes multiple layers of conductive elements 326, such as traces, pads, and via, and multiple layers of dielectric material 328. In various examples, the conductive elements 326 can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. The interlevel layers of dielectric material 328 can be constructed of glass(es) such as SiOx or other types of interlevel dielectric layer materials. In one example, the dielectric material 328 is a polyimide material or other suitable polymer material.

In one example, the RDL structure 330 is fabricated by depositing a layer of dielectric material 328 on the mold layer 306, exposed surfaces of the conductive pillars 308, and the exposed surfaces of the PIC interconnects 320 of the PIC modules 314. Preferably, the dielectric material 328 is the same material as the dielectric material 322 of the PIC modules 314. The dielectric material 328 can be applied using well-known spin coating and baking techniques and can be infused with photoactive compounds in order to establish openings for subsequently plated vias. Optionally, openings for the subsequently formed vias can be established by laser drilling or other types of etching techniques. Following establishment of the openings, the vias can be fabricated using well-known plating or other material deposition techniques. Next, a metallization layer is fabricated on the layer of dielectric material 328. The metallization layer can be an additive or subtractive process. In one example, the metallization layer is fabricated as a subtractive process in which a blanket layer of metallic material is deposited using well known vapor deposition techniques and then subsequently etched to define the individual conductive elements 326 such as traces, via pads, bond pads, and the like. Next, another layer of dielectric material 328 is deposited on the etched conductive elements, vias are formed and plated, another metallization layer is added and etched, and so on until the RDL structure 330 is complete.

Bond pads 332 are affixed to the surface of the RDL structure 330 at via locations. The conductive elements 326 form electrical connections between the PIC modules 314 and the bond pads 332, between the bond pads 332 and the conductive pillars 308, and between the PIC modules 314 and the conductive pillars 308. In one example, the bond pads 332 are micropads or other conductive bond sites. Although not shown, in some examples the RDL layer structure 330 also provides electrical routing for signals into and out of a bridge structure in a manner similar to the PIC modules 314.

Figure 6:
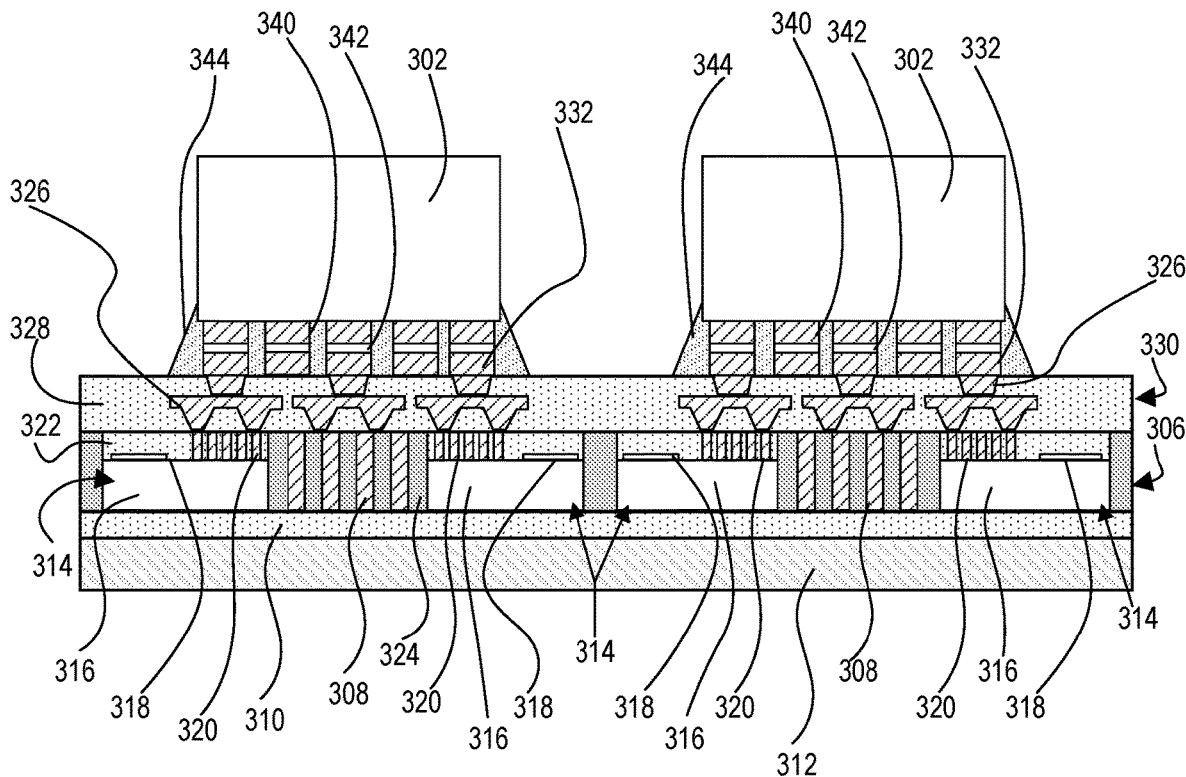
FIG. 6 is another portion of the example process flow for fabricating a fanout module integrating a photonic integrated circuit according to some implementations.

Moving to FIG. 6, the semiconductor chips 302 mounted to the RDL structure 330. In one example, the semiconductor chips 302 are flip chip mounted on the RDL structure 330 by bonding interconnects 340 of the semiconductor chip 302 to the bond pads 332 of the RDL structure 330 through suitable bonding techniques. For example, the semiconductor chips 302 can be secured to the RDL structure 330 both mechanically and electrically by way of a solder connection 342 between interconnects 340 and bond pads 332. Subsequently, underfill material 344 is positioned between the chips 302 and the RDL structure 330. The underfill material 344, for example, comprises a liquid epoxy, non-conductive paste (NCP), non-conductive film (NCF), deformable gel, silicon rubber, or the like, that is dispensed between the semiconductor chips 302 and RDL structure 330 and/or pre-laminated on the surface of memory die, and then cured to harden. This underfill material 344 is used, among other things, to reduce cracking and to protect the interconnects 340 and bond pads 332. For example, the underfill material 344 can be a capillary or molded. The underfill material 344 is then cured. Although not shown, in some examples peripheral components (e.g., HBM devices) that electrically connect to some of the conductive pillars and to the bridge structures are also mounted to the RDL structure 330 at this time.

Figure 7:
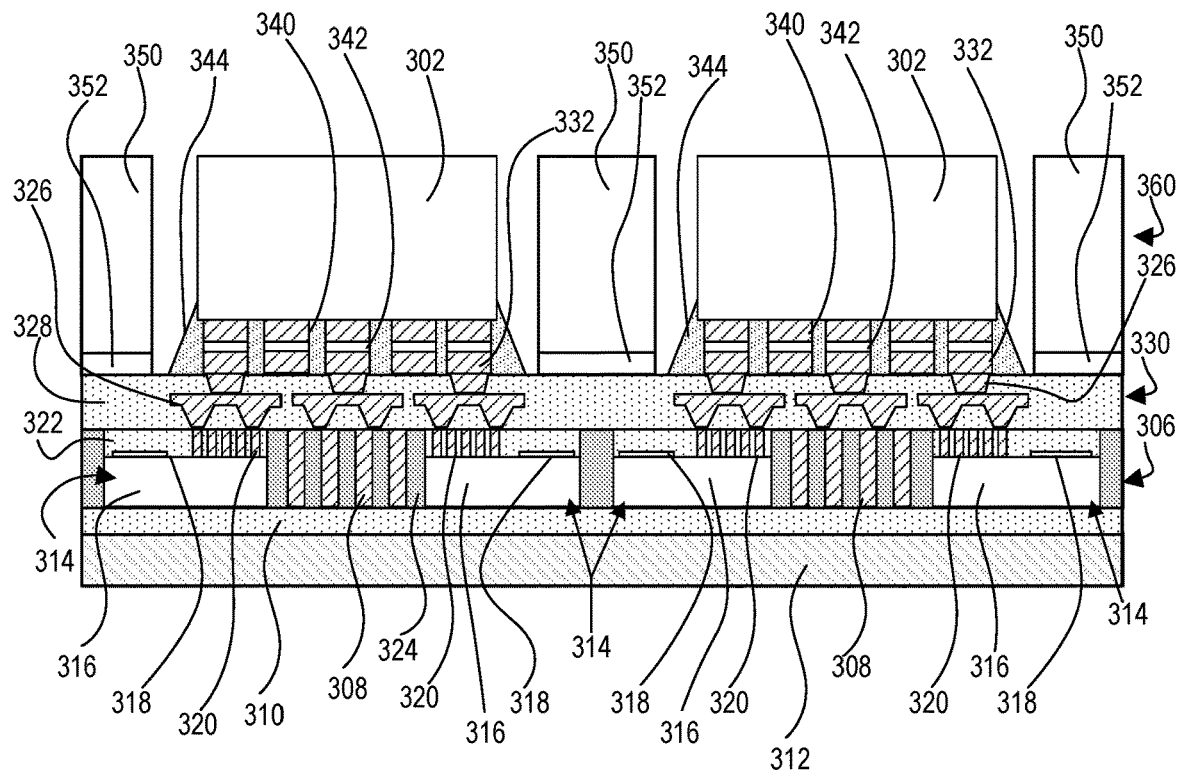
FIG. 7 is another portion of the example process flow for fabricating a fanout module integrating a photonic integrated circuit according to some implementations.

Moving to FIG. 7, spacers 350 are attached to the surface of the RDL structure 330 on opposite sides of each semiconductor chip 302. For example, the spacers 350 are attached using a release film 352. In some examples, the spacers 350 are silicon-based and are not electrically coupled to the RDL structure 330. Rather, the spacers 350 reserve space above the optical interface 318 of the PIC modules 314 during subsequent molding of the spacers 350, semiconductor chips 302, and exposed portions of the RDL structure 330.

Figure 8:
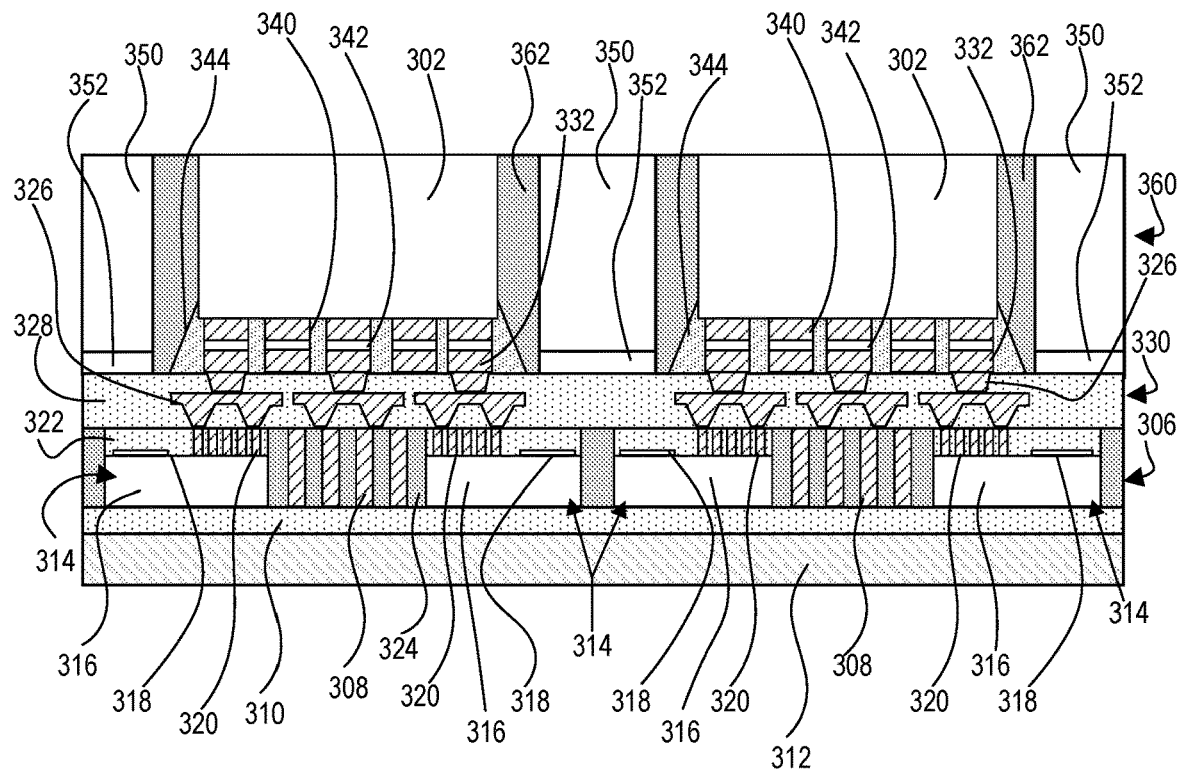
FIG. 8 is another portion of the example process flow for fabricating a fanout module integrating a photonic integrated circuit according to some implementations.

Moving to FIG. 8, a mold layer 360 is formed on and around the spacers 350, semiconductor chips 302, and exposed portions of the RDL structure 330. In one example, the mold layer 360 is created by depositing an encapsulant material 362 on the spacers 350, semiconductor chips 302, and exposed portions of the RDL structure 330 to encase those components in the encapsulant material 362. In some examples, the encapsulant material 362 is an inorganic oxide compound (e.g., SiOx). The molding can be performed by well-known compression molding techniques. The mold layer 360 can be subjected to a grinding process to expose the upper surfaces of the semiconductor chips 302 in anticipation of eventual mounting of some form of heat spreader or sink thereon. Although not shown, the mold layer is also formed on peripheral components such as the HBM device.

Figure 9:
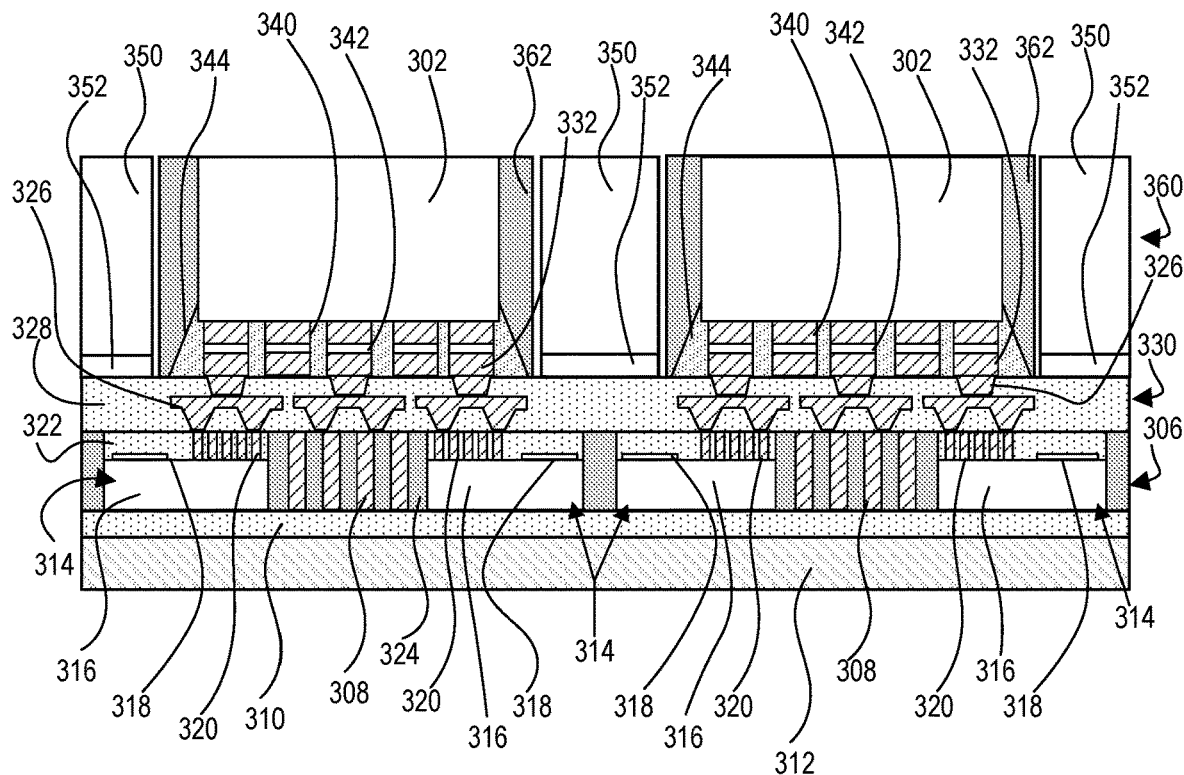
FIG. 9 is another portion of the example process flow for fabricating a fanout module integrating a photonic integrated circuit according to some implementations.

Moving to FIG. 9, the spacers 350 are separated from the surrounding encapsulant material 362. In one example, the spacers 350 are separated from the surrounding encapsulant material 362 by laser etching encapsulant material at the circumference of the spacers 350 all the way down to the release film 352. The release film 352 is then deactivated by applying light or heat to the release film 352.

Figure 10:
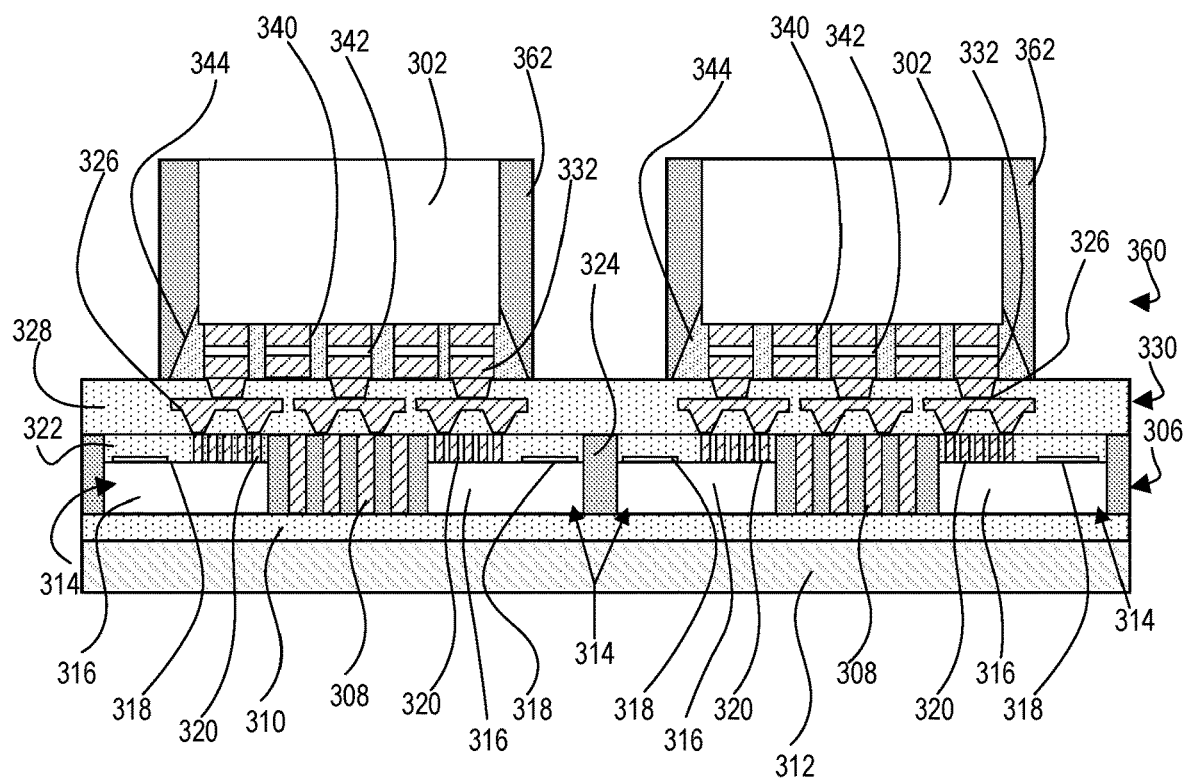
FIG. 10 is another portion of the example process flow for fabricating a fanout module integrating a photonic integrated circuit according to some implementations.

Moving to FIG. 10, the spacers 350 are removed and the RDL structure 330 is cleaned of any remaining release film 352. Any excess release film can be removed with a suitable solvent.

Figure 11:
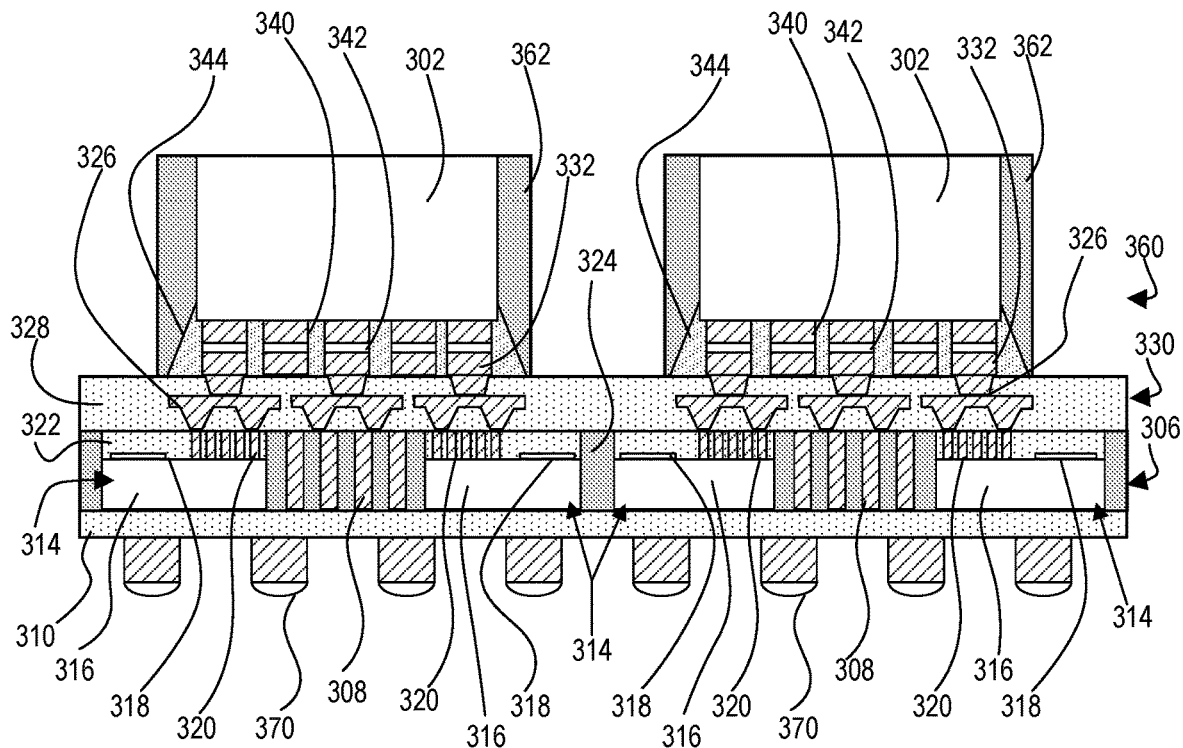
FIG. 11 is another portion of the example process flow for fabricating a fanout module integrating a photonic integrated circuit according to some implementations.

Moving to FIG. 11, the carrier 312 is removed and solder structures 370 (e.g., C4 bumps) are attached. In some examples, the carrier 312 is removed by deactivating a release film between the dielectric layer 310 and the carrier 312. The dielectric layer 310 can be processed to establish openings therein leading to the conductive pillars 308 in anticipation of the attachment of solder structures 370. Alternatively, the dielectric layer 310 could be processed earlier to establish the openings. With the openings established in the dielectric layer 310, the solder structures 370 are attached to the conductive pillars 308 by way of pick and place, stencil, or other solder attachment techniques. In some examples, where the PIC die 316 employs TSVs to connect the die contact surface to the surface of the bulk silicon, the dielectric layer 310 is processed to establish openings at the TSVs, and solder structures 370 are attached to the TSVs.

Figure 12:
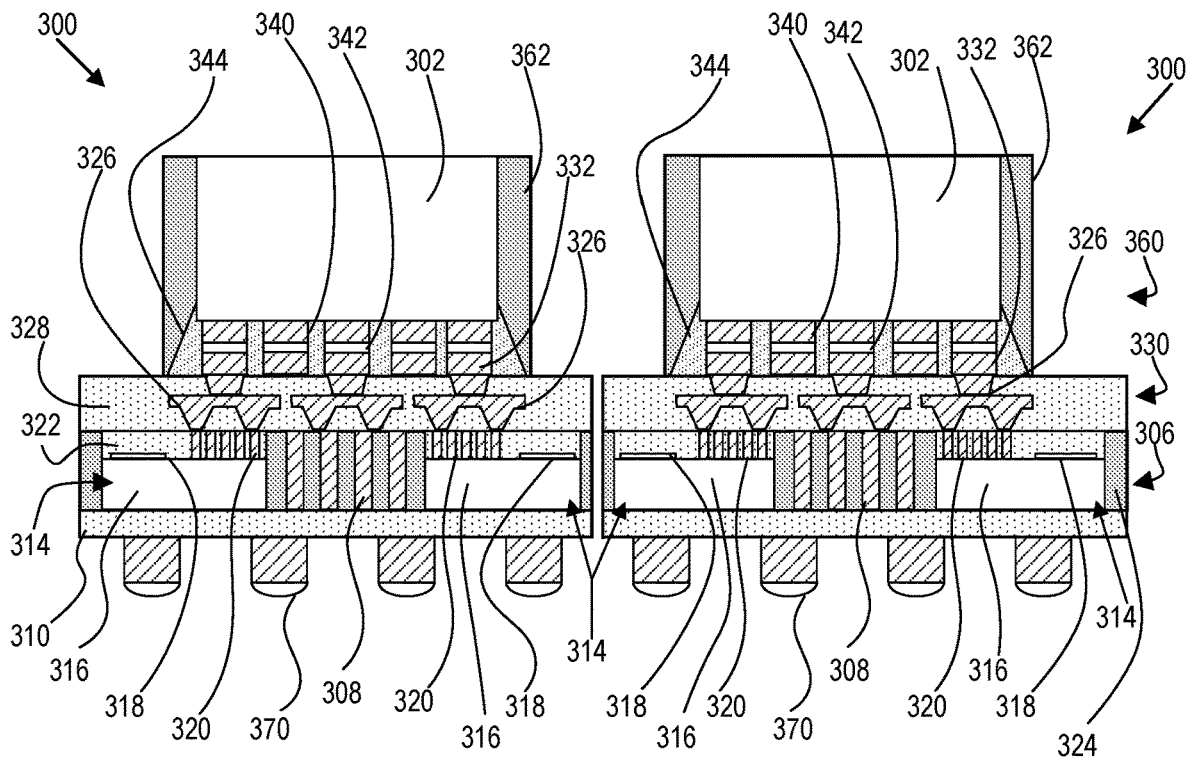
FIG. 12 is another portion of the example process flow for fabricating a fanout module integrating a photonic integrated circuit according to some implementations.

Moving to FIG. 12, the wafer is disposed on adhesive tape and a wafer saw is used to dice the package into singulated packages 300 that include the semiconductor chip 302 co-packaged with the PIC modules 314.

Figure 13:
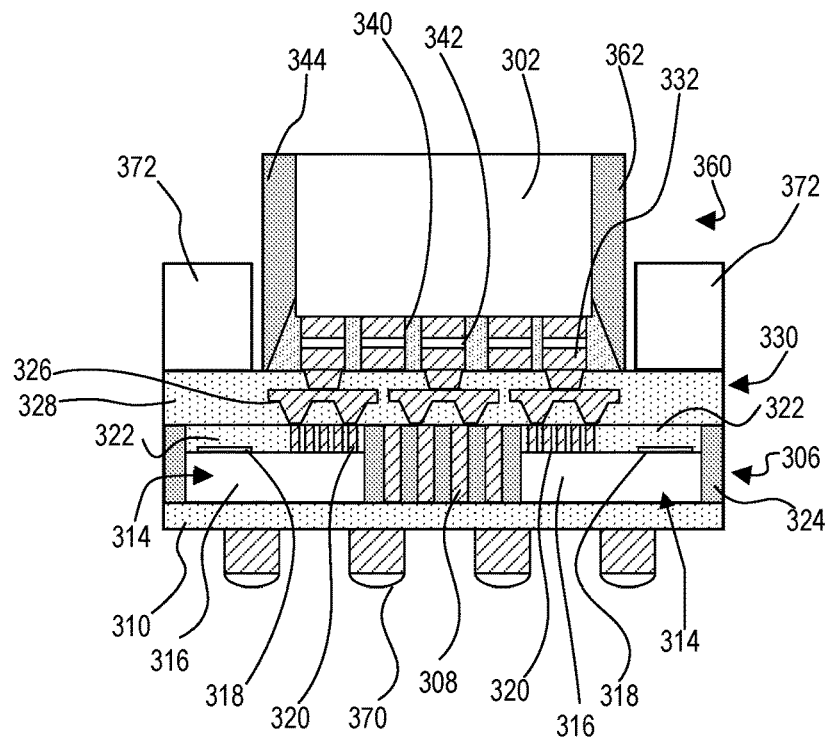
FIG. 13 is another portion of the example process flow for fabricating a fanout module integrating a photonic integrated circuit according to some implementations.

Moving to FIG. 13, optical connectors 372 are attached to the RDL structure 330. The optical connectors 372 include a coupling for optical fiber and a waveguide to carry light from the optical fiber to the dielectric surface of the RDL structure 330. Light emitted from the optical connectors 372 is shown through the dielectric material 322, 328 to the optical interface 318 of the PIC modules 314. Light emitted from the optical interface 318 of the PIC modules 314 is conveyed through the dielectric material 322, 328 to the optical connectors 372.

Figure 14:
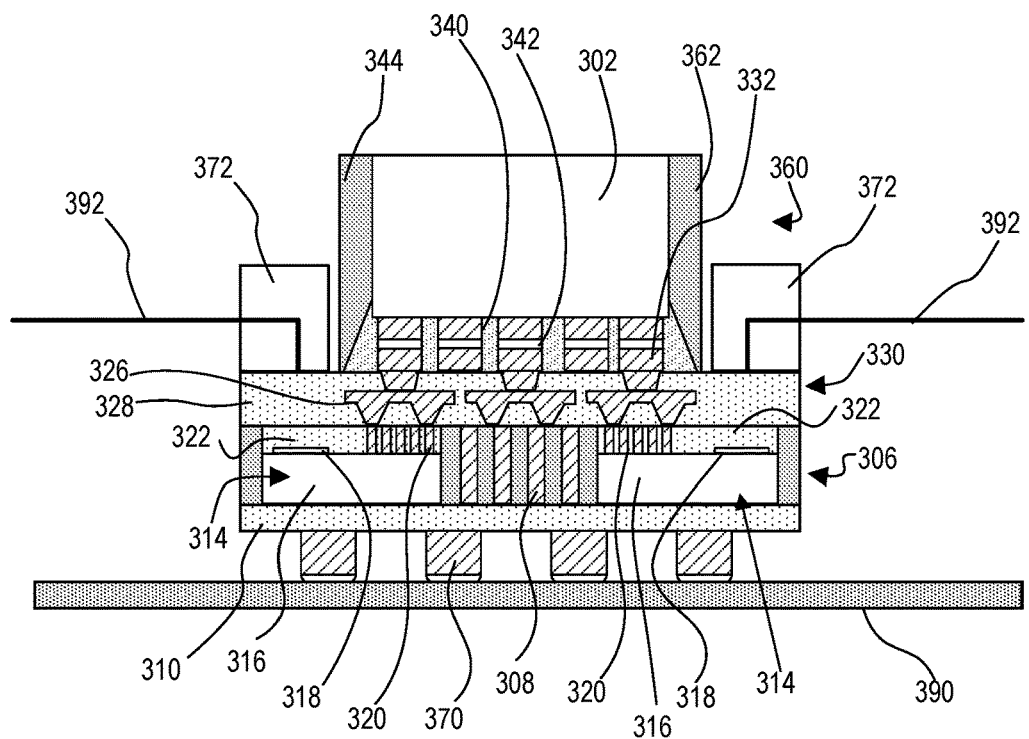
FIG. 14 is another portion of the example process flow for fabricating a fanout module integrating a photonic integrated circuit according to some implementations.

Moving to FIG. 14, the package structure 300 is mounted on a substrate 390. The substrate 190 supplies power and ground to the components of the package structure 300 and provides I/O pathways to external components. Optical fibers 392 are couplable to the optical connectors 372.

Figure 15:
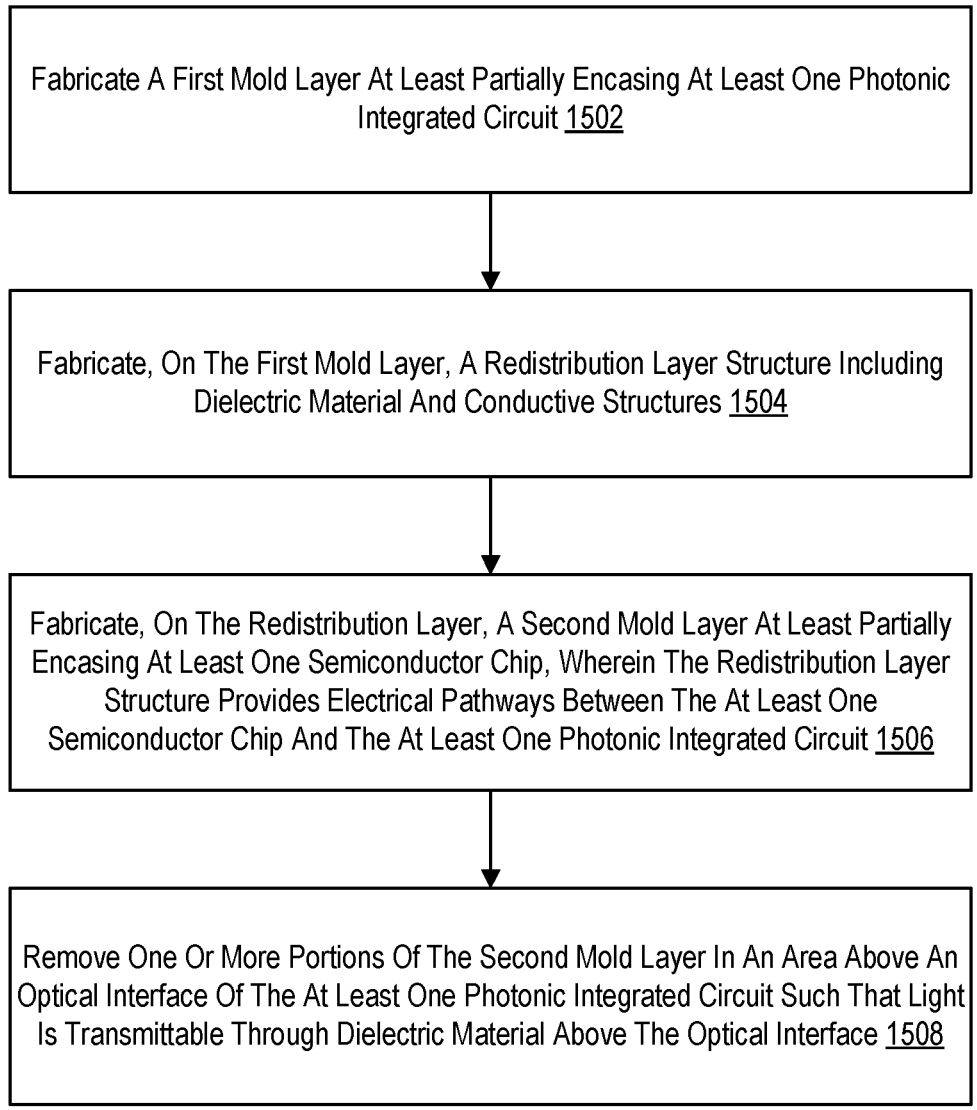
FIG. 15 is a flowchart of an example method of fabricating a fanout module integrating a photonic integrated circuit according to some implementations.

For further explanation, FIG. 15 sets forth a flow chart illustrating an example method of fabricating a fanout module integrating a photonic integrated circuit according to some implementations of the present disclosure. The example method of FIG. 15 includes fabricating 1502 a first mold layer at least partially encasing at least one photonic integrated circuit. In some examples, fabricating 1502 a first mold layer at least partially encasing at least one photonic integrated circuit is carried out by depositing a dielectric layer on a carrier and placing the photonic integrated circuit on the dielectric layer. For example, the photonic integrated circuit can be placed on the dielectric layer through pick and place process and attached via die attach film. In some examples, fabricating 1502 a first mold layer at least partially encasing at least one photonic integrated circuit is further carried out by creating conductive pillars on the dielectric layer. The photonic integrated circuit and conductive pillars are encased in an encapsulant material to form the first mold layer. The encapsulant material is ground and planarized to partially expose interconnects of the photonic integrated circuit and partially expose the conductive pillars. In some examples, fabricating 1502 a first mold layer at least partially encasing at least one photonic integrated circuit is carried out through the process flow detailed in FIGS. 3 and 4 and the description thereof.

The example method of FIG. 15 also includes fabricating 1504, on the first mold layer, a redistribution layer structure including dielectric material and conductive structures. In some examples, fabricating 1504, on the first mold layer, a redistribution layer structure including dielectric material and conductive structures is carried out by depositing a layer of dielectric material on the first mold layer and forming conductive vias in the layer dielectric material that electrically connect to some or all of the interconnects of the photonic integrated circuit and some or all of the conductive pillars. Fabricating 1504, on the first mold layer, a redistribution layer structure including dielectric material and conductive structures is further carried out by fabricating conductive traces and pads on the layer of dielectric material that electrically connect to the vias, and depositing another layer of dielectric material on the conductive traces and pads. This process can be repeated as many times as necessary to create a suitable number of metallization layers based on design constraints, as will be appreciated by those of skill in the art. Bond pads are created on dielectric material of the surface of the redistribution layer structure and electrically connected to the underlying network of conductive structures through vias in the top layer of dielectric material. An area of the redistribution layer structure above an optical interface of the photonic integrated circuit is left void of conductive structures such that only dielectric material is formed above the optical interface. In some examples, fabricating 1504, on the first mold layer, a redistribution layer structure including dielectric material and conductive structures is carried out through the process flow detailed in FIG. 5 and the description thereof.

The example method of FIG. 15 also includes fabricating 1506, on the redistribution layer, a second mold layer at least partially encasing at least one semiconductor chip, wherein the redistribution layer structure provides electrical pathways between the at least one semiconductor chip and the at least one photonic integrated circuit. In some examples, fabricating 1506, on the redistribution layer, a second mold layer at least partially encasing at least one semiconductor chip is carried out by flip chip bonding one or more semiconductor chips to the bond pads of the redistribution layer structure. The semiconductor chip is placed such that a portion of the semiconductor chip overhangs a portion of the photonic integrated circuit that includes the interconnects while leaving another portion of the photonic integrated circuit that includes the optical interface unobstructed by the semiconductor chip. An underfill material is deposited between the semiconductor chips and the redistribution layer structure. The one or more semiconductor chips and underfill material are encased in an encapsulant material to form the second mold layer. The encapsulant material can be ground and planarized to expose a surface of the one or more semiconductor chips, for example, for later attachment of a heat sink. In some examples, fabricating 1506, on the redistribution layer, a second mold layer at least partially encasing at least one semiconductor chip is carried out through the process flow detailed in FIG. 6 to FIG. 8 and the description thereof.

The example method of FIG. 15 also includes removing 1508 one or more portions of the second mold layer in an area above an optical interface of the at least one photonic integrated circuit such that light is transmittable through dielectric material above the optical interface. In some examples, removing 1508 one or more portions of the second mold layer in an area above an optical interface of the at least one photonic integrated circuit such that light is transmittable through dielectric material above the optical interface is carried out by removing portions of the encapsulant material of the second mold layer in an area that is above the optical interfaces of the photonic integrated circuits. The removal of the encapsulant material exposes a surface of the dielectric material that is above the optical interface. As previously discussed, this area is void of conductive structures. In some examples, the dielectric material allows light, entering the package structure through voids in the package structure created by the removal of the encapsulant material, to pass through the dielectric material to the optical interface. In some examples, the dielectric material allows light emitted from the optical interface to pass through the dielectric material to escape the package structure through voids in the package structure created by the removal of the encapsulant material. The dielectric material can be a polyimide material. In some examples, removing 1508 one or more portions of the second mold layer in an area above an optical interface of the at least one photonic integrated circuit such that light is transmittable through dielectric material above the optical interface is carried out through the process flow detailed in FIG. 9 and FIG. 10 and the description thereof.

Figure 16:
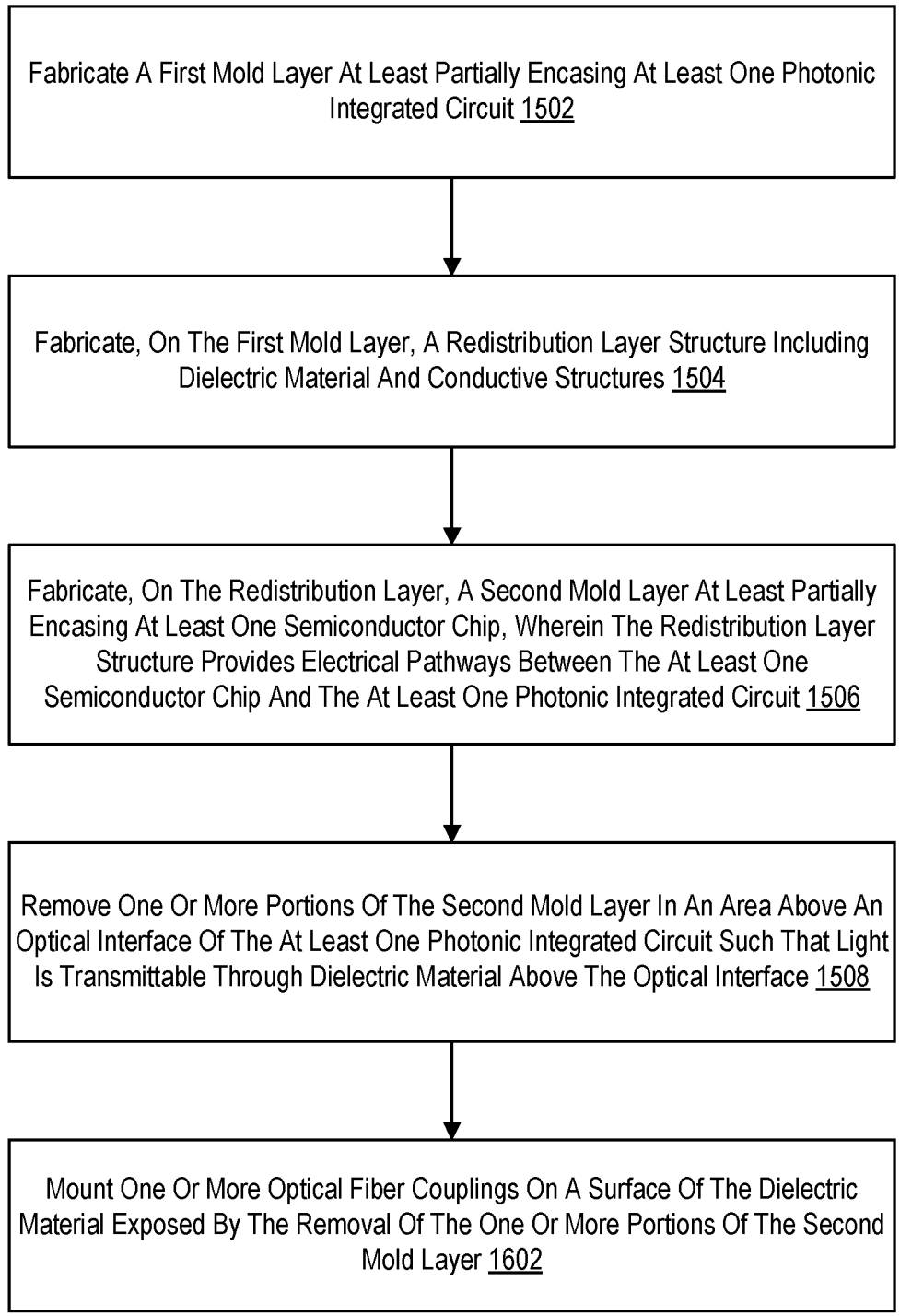
FIG. 16 is a flowchart of another example method of fabricating a fanout module integrating a photonic integrated circuit according to some implementations.

For further explanation, FIG. 16 sets forth a flow chart illustrating an example method of fabricating a fanout module integrating a photonic integrated circuit according to some implementations of the present disclosure. Like the example method of FIG. 15, the example method of FIG. 16 also includes fabricating 1502 a first mold layer at least partially encasing at least one photonic integrated circuit; fabricating 1504, on the first mold layer, a redistribution layer structure including dielectric material and conductive structures; fabricating 1506, on the redistribution layer, a second mold layer at least partially encasing at least one semiconductor chip; and removing 1508 one or more portions of the second mold layer in an area above an optical interface of the at least one photonic integrated circuit such that light is transmittable through dielectric material above the optical interface.

The example method of FIG. 16 also includes mounting 1602 one or more optical fiber couplings on a surface of the dielectric material exposed by the removal of the one or more portions of the second mold layer. In some examples, mounting 1602 one or more optical fiber couplings on a surface of the dielectric material exposed by the removal of the one or more portions of the second mold layer is carried out by placing one or more optical couplings within the voids in first mold layer created by the removal of the encapsulant material. Mounting 1602 one or more optical fiber couplings on a surface of the dielectric material exposed by the removal of the one or more portions of the second mold layer is further carried out by attaching the one or more optical couplings to the dielectric material on the surface of the redistribution layer structure that has been exposed by the removal of the encapsulant material. In some examples, mounting 1602 one or more optical fiber couplings on a surface of the dielectric material exposed by the removal of the one or more portions of the second mold layer is carried out through the process flow detailed in FIG. 13 and the description thereof.

Figure 17:
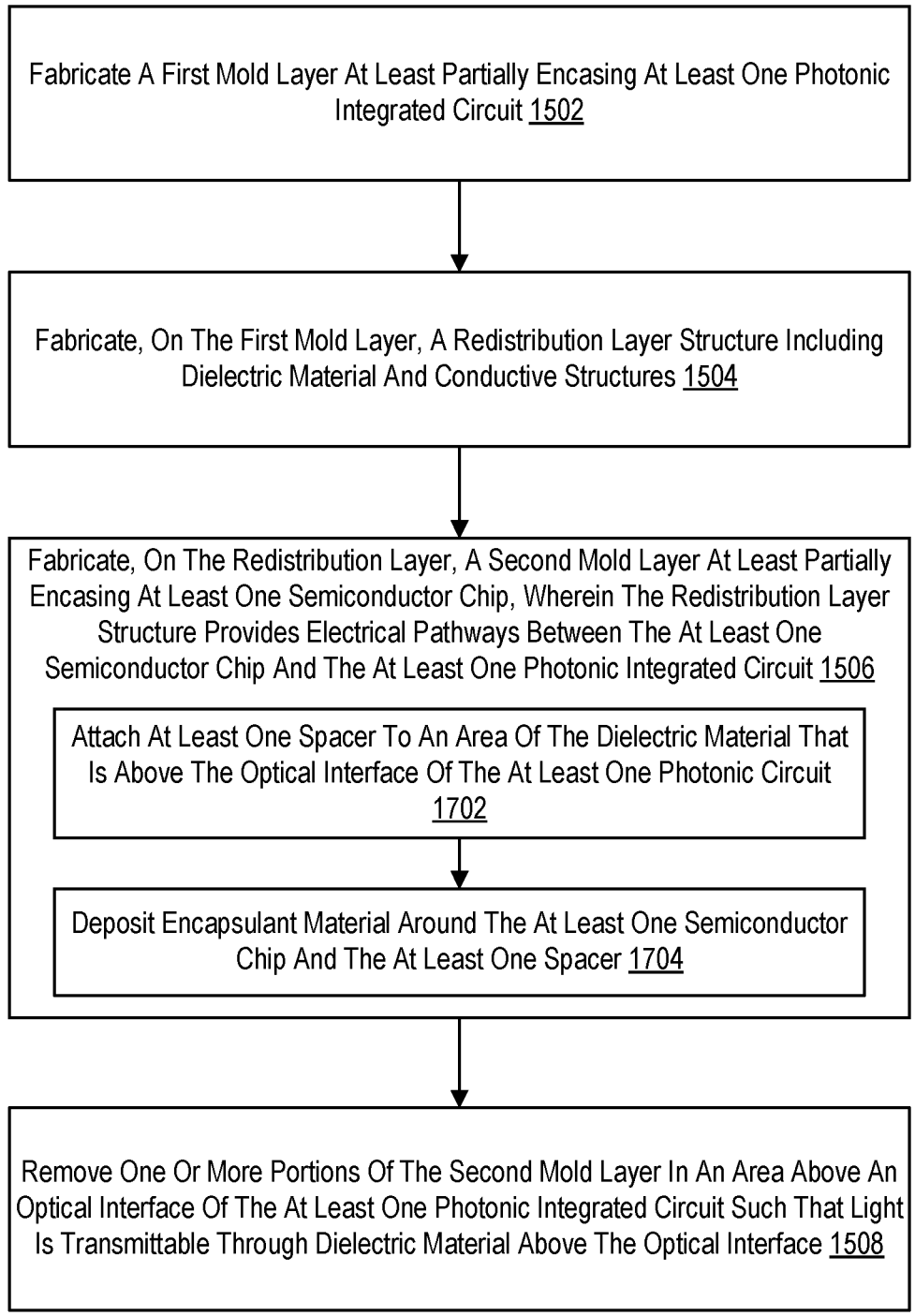
FIG. 17 is a flowchart of another example method of fabricating a fanout module integrating a photonic integrated circuit according to some implementations.

For further explanation, FIG. 17 sets forth a flow chart illustrating an example method of fabricating a fanout module integrating a photonic integrated circuit according to some implementations of the present disclosure. Like the example method of FIG. 15, the example method of FIG. 17 also includes fabricating 1502 a first mold layer at least partially encasing at least one photonic integrated circuit; fabricating 1504, on the first mold layer, a redistribution layer structure including dielectric material and conductive structures; fabricating 1506, on the redistribution layer, a second mold layer at least partially encasing at least one semiconductor chip; and removing 1508 one or more portions of the second mold layer in an area above an optical interface of the at least one photonic integrated circuit such that light is transmittable through dielectric material above the optical interface.

In the example of FIG. 17, fabricating 1506, on the redistribution layer, a second mold layer at least partially encasing at least one semiconductor chip includes attaching 1702 at least one spacer to an area of the dielectric material that is above the optical interface of the at least one photonic circuit. In some examples, attaching 1702 at least one spacer to an area of the dielectric material that is above the optical interface of the at least one photonic circuit is carried out by attaching a spacer (e.g., a silicon spacer) to the surface of the dielectric material of the redistribution layer structure that has been exposed by the removal of the dielectric material. The spacer is placed on an area of the dielectric material that is above the optical interface of the photonic integrated circuit. The one or more spacers can be attached via release film. In some examples, attaching 1702 at least one spacer to an area of the dielectric material that is above the optical interface of the at least one photonic circuit is carried out through the process flow detailed in FIG. 7 and the description thereof.

In the example of FIG. 17, fabricating 1506, on the redistribution layer, a second mold layer at least partially encasing at least one semiconductor chip also includes depositing 1704 encapsulant material around the at least one semiconductor chip and the at least one spacer. In some examples, depositing 1704 encapsulant material around the at least one semiconductor chip and the at least one spacer is carried out by encasing the one or more spacers, one or more semiconductor chips and underfill material in an encapsulant material to form the second mold layer. In some examples, depositing 1704 encapsulant material around the at least one semiconductor chip and the at least one spacer is carried out through the process flow detailed in FIG. 8 and the description thereof.

For further explanation, FIG. 18 sets forth a flow chart illustrating an example method of fabricating a fanout module integrating a photonic integrated circuit according to some implementations of the present disclosure. Like the example method of FIG. 17, the example method of FIG. 18 also includes fabricating 1502 a first mold layer at least partially encasing at least one photonic integrated circuit; fabricating 1504, on the first mold layer, a redistribution layer structure including dielectric material and conductive structures; fabricating 1506, on the redistribution layer, a second mold layer at least partially encasing at least one semiconductor chip including attaching 1702 at least one spacer to an area of the dielectric material that is above the optical interface of the at least one photonic circuit and depositing 1704 encapsulant material around the at least one semiconductor chip and the at least one spacer; and removing 1508 one or more portions of the second mold layer in an area above an optical interface of the at least one photonic integrated circuit such that light is transmittable through dielectric material above the optical interface.

In the example method of FIG. 18, removing 1508 one or more portions of the second mold layer in an area above an optical interface of the at least one photonic integrated circuit such that light is transmittable through dielectric material above the optical interface also includes cutting 1802 around the at least one spacer. In some examples, cutting 1802 around the at least one spacer includes cutting around the one or more spacers to separate the spacers from the surrounding encapsulant material of the second mold layer. For example, a laser saw can be used to cut around the spacers. In some examples, cutting 1802 around the at least one spacer is carried out through the process flow detailed in FIG. 9 and the description thereof.

The example method of FIG. 18, removing 1508 one or more portions of the second mold layer in an area above an optical interface of the at least one photonic integrated circuit such that light is transmittable through dielectric material above the optical interface also includes removing 1804 the at least one spacer, wherein the at least one spacer is attached to the dielectric material using release film. In some examples, removing 1804 the at least one spacer, wherein the at least one spacer is attached to the dielectric material using release film includes deactivating release film that attached the one or more spacers to the dielectric material on the surface of the redistribution layer structure. Deactivating the release film can be carried out by exposing the release film to light or heat. Removing 1804 the at least one spacer, wherein the at least one spacer is attached to the dielectric material using release film is further carried out by extracting the one or more spacers and cleaning remaining release film from the dielectric material. In some examples, removing 1804 the at least one spacer, wherein the at least one spacer is attached to the dielectric material using release film is carried out through the process flow detailed in FIG. 10 and the description thereof.

Figure 19:
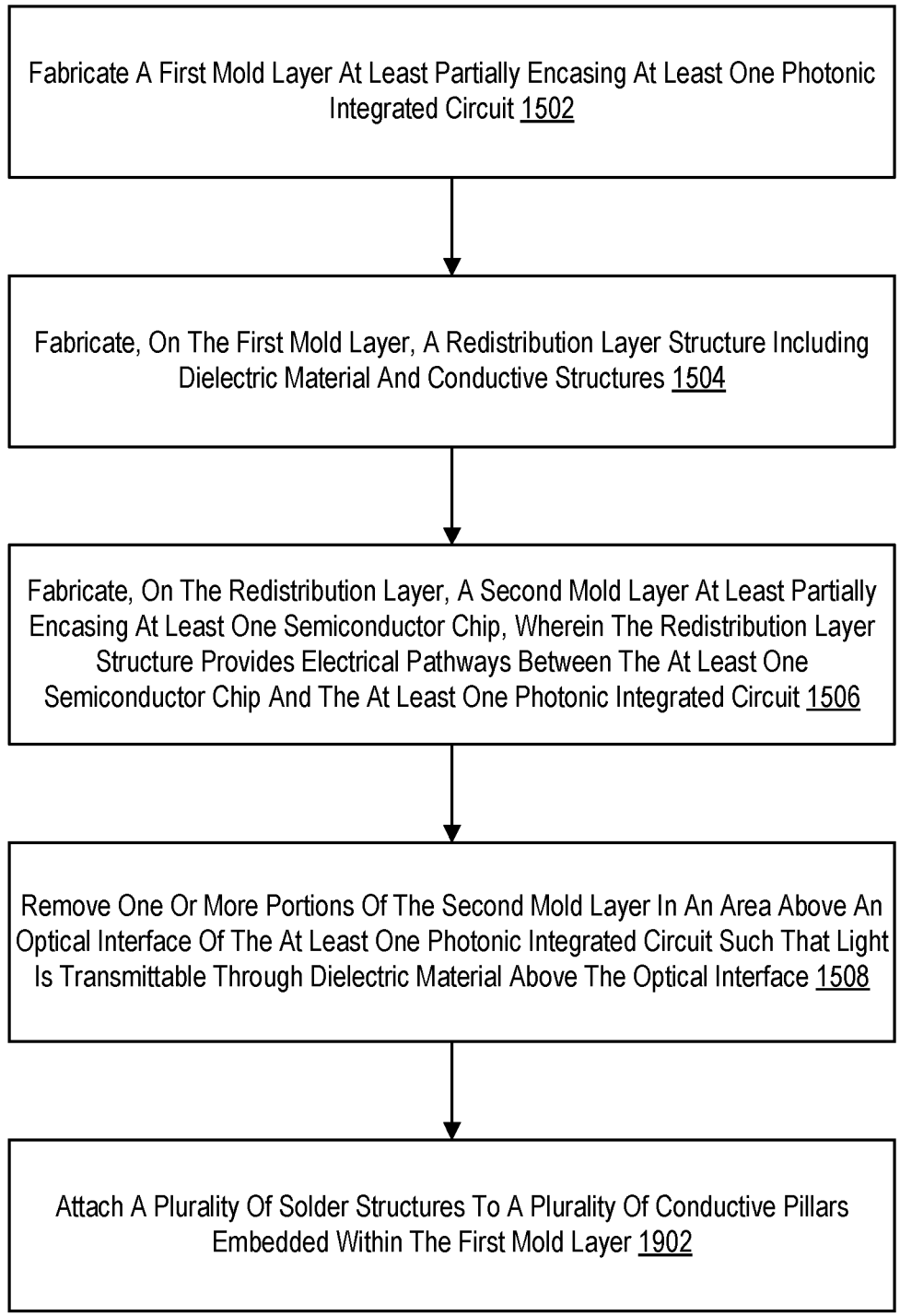
FIG. 19 is a flowchart of another example method of fabricating a fanout module integrating a photonic integrated circuit according to some implementations.

For further explanation, FIG. 19 sets forth a flow chart illustrating an example method of fabricating a fanout module integrating a photonic integrated circuit according to some implementations of the present disclosure. Like the example method of FIG. 15, the example method of FIG. 19 also includes fabricating 1502 a first mold layer at least partially encasing at least one photonic integrated circuit; fabricating 1504, on the first mold layer, a redistribution layer structure including dielectric material and conductive structures; fabricating 1506, on the redistribution layer, a second mold layer at least partially encasing at least one semiconductor chip; and removing 1508 one or more portions of the second mold layer in an area above an optical interface of the at least one photonic integrated circuit such that light is transmittable through dielectric material above the optical interface.

The example method of FIG. 19 also includes attaching 1902 a plurality of solder structures to a plurality of conductive pillars embedded within the first mold layer. In some examples, attaching 1902 a plurality of solder structures to a plurality of conductive pillars embedded within the first mold layer is carried out by removing a carrier supporting the package structure and partially exposing conductive pillars embedded in the first mold layer. For example, where a dielectric layer is formed between the first mold layer and the carrier, after the carried is removed, the dielectric layer is processed to form conductive vias electrically connecting to the conductive pillars. Solder structures are then attached at the vias to electrically connect to the conductive pillars. In some examples, attaching 1902 a plurality of solder structures to a plurality of conductive pillars embedded within the first mold layer is carried out through the process flow detailed in FIG. 11 and the description thereof.

In view of the foregoing description, implementations in accordance with the present disclosure provide a number of advantages. Implementations provide an architecture that allows a photonic integrated circuit to be co-packaged with a semiconductor chip or other semiconductor chips. Implementations provide short distance electrical connection from the photonic integrated circuit to these semiconductor chips while still offering access for optical fiber coupling to the photonic integrated circuit. Implementations minimize the footprint of the package by placing the photonic integrated circuit partially beneath an electrically coupled semiconductor chip. Moreover, fabrication of such a package can be integrated with processes that use an embedded bridge structure.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor package comprising:
   a photonic integrated circuit die including a first surface having disposed thereon a photodetector and a plurality of interconnects; and
   a semiconductor chip mounted above only a first portion of the first surface, wherein the photodetector is disposed on a second portion of the first surface that is outside of the first portion.

2. The semiconductor package of claim 1, wherein an optical coupling is disposed above the photodetector of the photonic integrated circuit die.

3. The semiconductor package of claim 1, further comprising a first encapsulant layer at least partially encasing the semiconductor chip, wherein the first encapsulant layer defines a void through which the photodetector of the photonic integrated circuit die is exposed.

4. The semiconductor package of claim 3, wherein an optical coupling is disposed within the void.

5. The semiconductor package of claim 1, further comprising a dielectric layer deposited on the photonic integrated circuit die, the dielectric layer comprising a light transmissible material.

6. The semiconductor package of claim 1, wherein the photonic integrated circuit die includes one or more through-silicon vias electrically connecting the first surface of the photonic integrated circuit die to a second surface of the photonic integrated circuit die.

7. The semiconductor package of claim 1, wherein the photonic integrated circuit die and at least one bridge die are embedded in a second encapsulant layer.

8. An apparatus comprising:
   a substrate;
   a semiconductor package mounted on the substrate, the semiconductor package including:
      a photonic integrated circuit die including a first surface having disposed thereon a photodetector and a plurality of interconnects; and
      a semiconductor chip mounted above only a first portion of the first surface, wherein the photodetector is disposed on a second portion of the first surface that is outside of the first portion; and
      an optical coupling disposed above the photodetector of the photonic integrated circuit die; and one or more optical fibers coupled to the optical coupling.

9. The apparatus of claim 8, further comprising a first encapsulant layer at least partially encasing the semiconductor chip, wherein the first encapsulant layer defines a void through which the photodetector of the photonic integrated circuit die is exposed.

10. The apparatus of claim 9, wherein the optical coupling is disposed within the void.

11. The apparatus of claim 8, further comprising a dielectric layer deposited on the photonic integrated circuit die, the dielectric layer comprising a light transmissible material.

12. The apparatus of claim 8, wherein the photonic integrated circuit die includes one or more through-silicon vias electrically connecting the first surface of the photonic integrated circuit die to a second surface of the photonic integrated circuit die.

13. The apparatus of claim 8, wherein the photonic integrated circuit die and at least one bridge die are embedded in a second encapsulant layer.

14. A method of fabricating a semiconductor package including an embedded photonic integrated circuit, the method comprising:
   mounting a photonic integrated circuit die including a first surface having disposed thereon a photodetector and a plurality of interconnects; and
   mounting a semiconductor chip above only a first portion of the first surface, wherein the photodetector is disposed on a second portion of the first surface that is outside of the first portion.

15. The method of claim 14 further comprising:
   depositing encapsulant material to at least partially encase the semiconductor chip; and
   defining a void in the encapsulant material through which the photodetector of the photonic integrated circuit die is exposed.

16. The method of claim 14 further comprising:
   mounting an optical coupling above the photodetector of the photonic integrated circuit die.

* * * * *